United States Patent
Shi et al.

(10) Patent No.: US 9,048,820 B2
(45) Date of Patent: Jun. 2, 2015

(54) HIGH-SPEED FULLY-DIFFERENTIAL CLOCK DUTY CYCLE CALIBRATION CIRCUIT

(75) Inventors: Longxing Shi, Jiangsu (CN); Danhong Gu, Jiangsu (CN); Junhui Gu, Jiangsu (CN); Jianhui Wu, Jiangsu (CN); Wei Zhao, Jiangsu (CN); Zhiyi Ye, Jiangsu (CN); Dahai Hu, Jiangsu (CN); Meng Zhang, Jiangsu (CN); Hong Li, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 5 days.

(21) Appl. No.: 13/978,710

(22) PCT Filed: Aug. 18, 2011

(86) PCT No.: PCT/CN2011/078560
§ 371 (c)(1),
(2), (4) Date: Sep. 16, 2013

(87) PCT Pub. No.: WO2012/094891
PCT Pub. Date: Jul. 19, 2012

(65) Prior Publication Data
US 2014/0002158 A1 Jan. 2, 2014

(30) Foreign Application Priority Data
Jan. 11, 2011 (CN) .......................... 2011 1 0004192

(51) Int. Cl.
H03K 3/017 (2006.01)
H03K 5/04 (2006.01)
H03K 7/08 (2006.01)
H03K 5/156 (2006.01)

(52) U.S. Cl.
CPC .............. *H03K 3/017* (2013.01); *H03K 5/1565* (2013.01)

(58) Field of Classification Search
CPC ....... H03K 3/017; H03K 7/08; H03K 5/1565; H03L 7/0814
USPC .................................................. 327/172, 175
See application file for complete search history.

(56) References Cited

U.S. PATENT DOCUMENTS

| | | | |
|---|---|---|---|
| 7,501,870 B2 * | 3/2009 | Choi et al. ..................... | 327/175 |
| 2004/0108878 A1 | 6/2004 | Dosho et al. | |
| 2006/0152265 A1 | 7/2006 | Kim et al. | |
| 2008/0157841 A1 * | 7/2008 | Johnson ........................ | 327/175 |

FOREIGN PATENT DOCUMENTS

| | | |
|---|---|---|
| CN | 1507156 A | 6/2004 |
| CN | 1812262 A | 8/2006 |
| CN | 101834587 A | 9/2010 |
| CN | 102111132 A | 6/2011 |
| CN | 201918969 U | 8/2011 |

* cited by examiner

*Primary Examiner* — John Poos
(74) *Attorney, Agent, or Firm* — Christensen Fonder P.A.

(57) ABSTRACT

A high-speed fully differential clock duty cycle calibration circuit applied to calibrating the clock duty cycle in a high-speed system. The circuit detects the duty cycle with a continuous time integrator, and directly adjusts the duty cycle on a clock transmission link so as to increase the working speed. Being of a fully differential circuit structure, the circuit can calibrate the duty cycle under a designated process within a higher and wider frequency range, and has relatively good constraining force for process mismatch and common mode noise. The circuit comprises adjustment level ADJ1 and ADJ2, a first buffer level BUF1, a second buffer level BUF2 and a duty cycle detection level DCD.

5 Claims, 3 Drawing Sheets

US 9,048,820 B2
HIGH-SPEED FULLY-DIFFERENTIAL CLOCK DUTY CYCLE CALIBRATION CIRCUIT

PRIORITY CLAIM

The present application is a National Phase entry of PCT Application No. PCT/CN2011/078560, filed Aug. 18, 2011, which claims priority from Chinese Application Number 201110004192.X, filed Jan. 11, 2011, the disclosures of which are hereby incorporated by reference herein in their entirety.

FIELD OF THE INVENTION

The present invention is applicable to a variety of application scenarios of clock duty cycle calibration for high-speed communication transmission, such as high speed data storage devices and pipeline processors, etc., and belongs to the technical field of duty cycle calibration circuit design.

BACKGROUND OF THE INVENTION

As integrated circuit technology advances, chips have increasingly higher operating speeds, and have widely employed techniques such as double data rate (DDR) and pipelines to achieve higher data throughput. However, operation at higher speeds necessitates stricter requirements for accuracy of time sequencing, which means stricter requirements for the performance of system time clocks, wherein, an important performance index is the duty cycle of the clock. A clock with 50% duty cycle is the most advantageous for data dissemination. For a system that employs a DDR and pipeline operation mode, 50% duty cycle ensures that the data can be established and maintained correctly in the transmission process and ensures normal and stable operation of the system.

In actual applications, the system clock is usually generated by means of a phase locked loop (PLL) or delay locked loop (DLL). In this process, the clock generated after frequency multiplication and synchronization often cannot ensure 50% duty cycle, owing to the mismatch resulting from the circuit design itself and the deviation between the chip manufacturing process and the simulated model. In addition, a duty cycle mismatch of the clock will also occur in the clock transmission process, since there is system and process deviation in the transmission link. Especially in high frequency applications, a duty cycle mismatch may even cause the clock signal to not flip over normally, and thereby result in severe time sequence errors. Therefore, it is necessary to introduce a duty cycle calibration circuit in application scenarios in which the requirement for a duty cycle is very strict.

At present, there are mainly two approaches for duty cycle calibration: a digital approach and an analog approach. The digital approach often cannot achieve an accurate calibration result because it is limited by the minimum delay unit and because the calibration accuracy has a nature of discreteness; in addition, through the digital approach, the operating speed is not high enough owing to the requirement of the time sequence because the digital approach usually utilizes phase synthesis, count detection, etc. There are a variety of methods in an analog approach, with the difference among them mainly lying in the detection mode of the duty cycle. However, compared to the digital approach, most methods in the analog approach can achieve higher duty cycle calibration accuracy, operate at a higher frequency, and obtain smaller edge jitter.

SUMMARY OF THE INVENTION

Technical Problem

The object of the present invention is to provide a duty cycle calibration circuit for a high-speed clock which can solve the technical problems in the prior art described above and accomplish clock duty cycle calibration in a high speed system. The circuit employs a continuous time integrator to detect the duty cycle and adjusts the duty cycle directly on the clock transmission link, so as to increase the operating speed.

Technical Scheme

The object of the present invention is to provide a circuit that can calibrate the duty cycle within a higher and wider frequency range with a specific technology process, to overcome the drawbacks in the duty cycle calibration circuits in the prior art. In addition, the technical scheme provided in the present invention has strong capability for inhibiting the phenomenon of process mismatch.

The duty cycle calibration circuit for high-speed full-differential clock provided in the present invention comprises a first adjustment stage ADJ1, a first buffer stage BUF1, a second adjustment stage ADJ2, a second buffer stage BUF2, and a duty cycle detection stage DCD; wherein, the first and second signal input terminals at the left side of the first adjustment stage ADJ1 are connected to the raw differential input signals (CLK+, CLK−) to be calibrated; the output signals (OUT1−, OUT1+) from the first and second output signal terminals of the first adjustment stage ADJ1 are connected to the first and second signal input terminals of the first buffer stage BUF1; the output signals (OUTB1+, OUTB1−) from the first and second signal output terminals of the first buffer stage BUF1 are connected to the first and second signal input terminals of the second adjustment stage ADJ2, so as to further calibrate the duty cycle; the output signals (OUT2−, OUT2+) from the first and second signal output terminals of the second adjustment stage ADJ2 are connected to the first and second signal input terminals of the second buffer stage BUF2; the output signals (CKO+, CKO−) from the first and second signal output terminals of the second buffer stage BUF2 are calibrated differential clock signals with 50% duty cycle; meanwhile, the clock signals (CKO+, CKO−) from the first and second signal output terminals of the second buffer stage BUF2 are connected to the first and second signal input terminals of the duty cycle detection stage DCD; the output signal (CP) from the first signal output terminal of the duty cycle detection stage DCD is fed back and connected to the third signal input terminal of the first adjustment stage ADJ1 and the third signal input terminal of the second adjustment stage ADJ2, the output signal (CN) from the second signal output terminal of the duty cycle detection stage DCD is fed back and connected to the fourth signal input terminal of the first adjustment stage ADJ1 and the fourth signal input terminal of the second adjustment stage ADJ2, so as to adjust the duty cycle.

In the first adjustment stage ADJ1, the source electrodes and substrates of a first transistor M1, a second transistor M2, a third transistor M3, and a fourth transistor M4 are connected to the power supply respectively; the grid electrodes of the first transistor M1 and the second transistor M2 are connected to the positive and negative control voltage CP and CN respectively; the drain electrode of the first transistor M1, the grid electrode and drain electrode of the second transistor M2, and the drain electrode of a fifth transistor M5 are connected to each other to provide output signal OUT1−; likewise, the drain electrode of the fourth transistor M4, the grid electrode and drain electrode of the third transistor M3, and drain electrode of a sixth transistor M6 are connected to each other to provide output signal OUT1+; the substrates of the fifth transistor M5 and the sixth transistor M6 are each grounded respectively; the grid electrode of the fifth transistor M5 is connected to the input signal CLK+, and the grid electrode of the sixth transistor M6 is connected to the input signal CLK−; the source electrodes of the fifth transistor M5 and the sixth transistor M6 are connected to each other and then connected to the drain electrode of a seventh transistor M7; the grid electrode of the seventh transistor M7 is connected to a bias voltage Vb, and the source electrode and substrate of the seventh transistor M7 are each grounded respectively. M1~M4 are PMOS transistors; M5~M7 are NMOS transistors.

The first buffer stage BUF1 comprises a first buffer 201 and a second buffer 202 that are cascaded serially, wherein, the first and second signal input terminals of the first buffer 201 are connected to the output signals (OUT1+, OUT1−) from the first and second output terminals of the first adjustment stage ADJ1, and the output signals from the first and second output terminals of the second buffer are differential clock signals (OUTB1+, OUTB1−) after once duty cycle calibration.

The second buffer stage BUF2 comprises a first buffer 301, a second buffer 302, a third buffer 303, and a fourth buffer 304 that are cascaded serially, wherein, the first and second signal input terminals of the first buffer 301 are connected to the output signals (OUT2+, OUT2−) from the first and second output terminals of the second adjustment stage, and the output signals from the first and second output terminals of the fourth buffer 304 are differential clock signals (CKO+, CKO−) with 50% duty cycle after twice calibrations.

The duty cycle detection stage DCD comprises a first resistor 401, a second resistor 402, a first capacitor 403, a second capacitor 404, and an amplifier 405. One terminal of the first resistor 401 and second resistor 402 are connected to the output signals (CKO+, CKO−) from the first and second signal output terminals of the second buffer stage BUF2 respectively; the other terminal of the first resistor 401 is connected to one terminal of the first capacitor 403 and then connected to the negative input terminal of the amplifier 405; the other terminal of the second resistor 402 is connected to one terminal of the second capacitor 404 and then connected to the positive input terminal of the amplifier 405; the other terminal of the first capacitor 403 is connected to the positive output terminal of the amplifier 405, which is the output control voltage CP; the other terminal of the second capacitor 404 is connected to the negative output terminal of the amplifier 405, which is the output control voltage CN.

Beneficial Effects compared to the prior art, the present invention has the following advantages:

1. The present invention employs a continuous time integrator as the duty cycle detection means, and therefore has a wide operating frequency range; the integrating function is implemented with passive components (i.e., resistors and capacitors), and the circuit can operate at a high frequency. Compared to the detection method that is based on a charge pump, the present invention reduces errors resulting from various mismatches.
2. The present invention maximizes the speed of duty cycle calibration when compared to existing methods that employ clock synthesis in the prior art since the present invention carries out duty cycle calibration directly in the clock link.
3. The present invention employs a differential circuit structure to reduce switching noise and employs CML logic in the buffer stage. Since the bias current is fixed, the power consumption will not increase as the frequency increases, unlike conventional CMOS circuits.

DETAILED DESCRIPTION OF THE EMBODIMENTS

Hereunder the present invention will be detailed in embodiments, with reference to the accompanying drawings.

Figure 1:
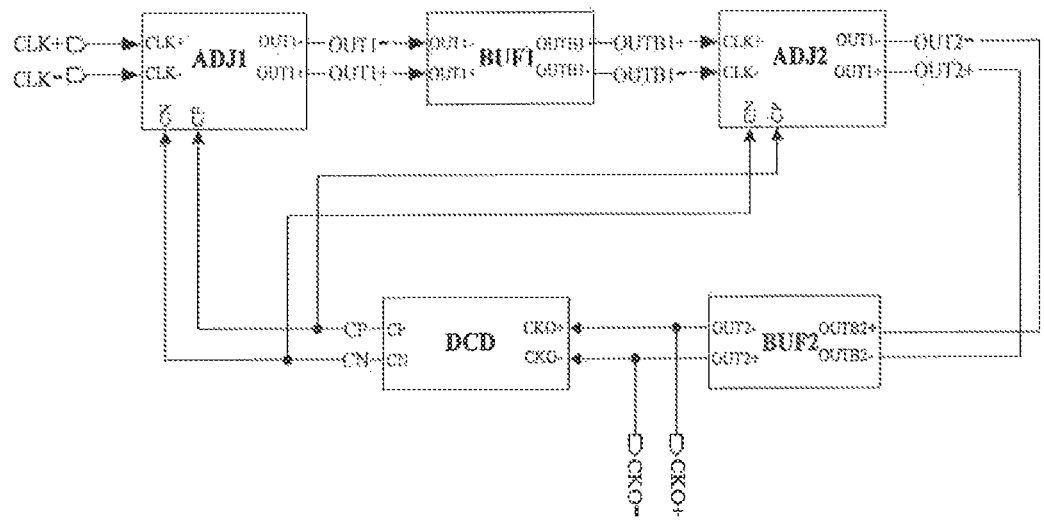
FIG. 1 is a structural block diagram of the present invention.

The present invention carries out duty cycle calibration directly in the clock link. As shown in FIG. 1, the differential clock input signals CLK+ and CLK− are directly inputted to the first adjustment stage, so as to adjust the duty cycle by adjusting the rising-falling time; the output signals are fed afterwards into the second adjustment stage through the first buffer stage, and are adjusted in the same way as the adjustment in the first adjustment stage; then, the output signals pass through the second buffer stage and become calibrated clock signals. Meanwhile, the output clock signals enter into the duty cycle detection stage and create control voltage CP and CN, which are fed back to the first and second adjustment stages such that a duty cycle calibration loop is formed and the duty cycle is calibrated further, until the final output clock signals have a 50% duty cycle.

Adjustment of the Duty Cycle

Figure 2A:
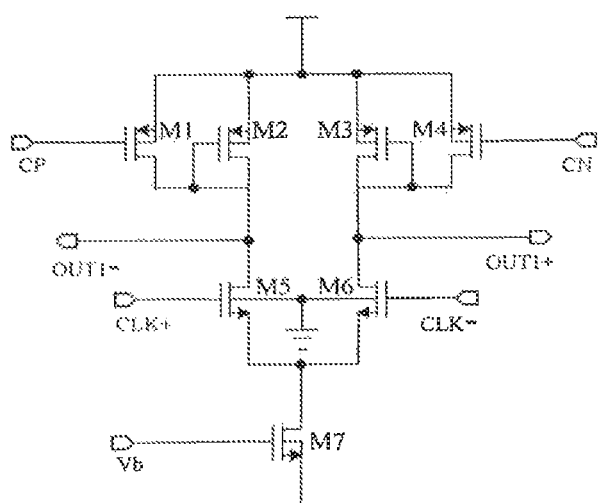
FIG. 2a is a structural schematic diagram of the first or second adjustment stage.
Figure 2B:
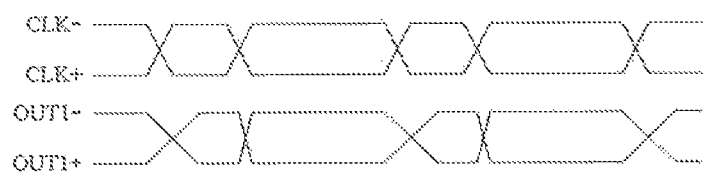
FIG. 2b is a time sequence diagram of duty cycle adjustment in the adjustment stage.

The duty cycle adjustment stage in the present invention accomplishes duty cycle adjustment by adjusting the rising-falling time of the clock; after the signals CLK+ and CLK− are inputted into the adjustment stage, the rising time and falling time are controlled by CP and CN. If the duty cycle of the input clock signals is lower than 50%, the CP will decrease, so that the OUT1− charging current will be increased, the rising time will be reduced, the discharging current will be decreased, and the falling time will be increased; likewise, the CN will increase, so that the OUT1+ charging current will be decreased, the rising time will be increased, the discharging current will be increased, and the falling time will be decreased; thereby duty cycle adjustment is accomplished. The structure and time sequence of the adjustment stage are shown in FIG. 2a and FIG. 2b. After the first cycle of adjustment, the clock signals will be fed to the second buffer stage after through the first buffer stage BUF1, so that the duty cycle can be further calibrated. The two-stage cascaded adjustment stage widens the duty cycle calibration range.

Detection of the Duty Cycle

Figure 3:
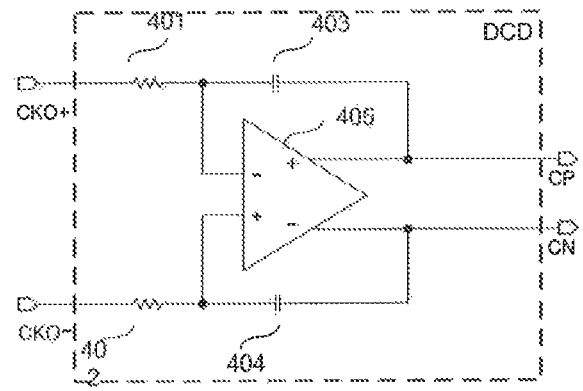
FIG. 3 is a structural block diagram of the duty cycle detection stage.

The present invention utilizes a continuous time integrator as the means for duty cycle detection. The principle of duty cycle detection with the integrator is shown in FIG. 3. The input signals are denoted as CKO+ and CKO− and the output signals as CP and CN, then:

$$\frac{d}{dt}(CP) = \frac{d}{dt}\left\{\frac{1}{RC}\left[\int_0^{t_H}(VDD-VSS)dt + \int_{t_H}^T(VSS-VDD)dt\right]\right\}$$

$$\frac{d}{dt}(CN) = \frac{d}{dt}\left\{\frac{1}{RC}\left[\int_0^{t_H}(VSS-VDD)dt + \int_{t_H}^T(VDD-VSS)dt\right]\right\}$$

Suppose the high-level duration of CKO+ as $t_H$ and the low-level duration as $t_L$, then:

$$\frac{d}{dt}(CP) = \frac{d}{dt}\left\{\frac{1}{RC}[VDD(t_H-t_L)+VSS(t_L-t_H)]\right\}$$

$$\frac{d}{dt}(CN) = \frac{d}{dt}\left\{\frac{1}{RC}[VSS(t_H-t_L)+VDD(t_L-t_H)]\right\}$$

When the duty cycle is 50%, $t_H=t_L$, then $$\frac{d}{dt}(CP) = 0, \frac{d}{dt}(CN) = 0,$$

i.e., CP and CN remain constant, and the duty cycle adjustment is terminated.

Figure 4:
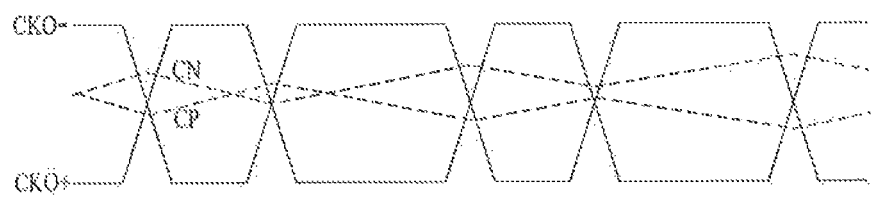
FIG. 4 is a time sequence diagram of the duty cycle detection stage.

When the duty cycle is lower than 50%, $t_H<t_L$, then $$\frac{d}{dt}(CP) < 0, \frac{d}{dt}(CN) > 0,$$

decrease CP further and increase CN further, and continue the duty cycle adjustment, till the duty cycle reaches 50%, as illustrated by the waveform in FIG. 4.

When the duty cycle is higher than 50%, $t_H>t_L$, then $$\frac{d}{dt}(CP) > 0, \frac{d}{dt}(CN) < 0,$$

increase CP further and decrease CN further, and continue the duty cycle adjustment, till the duty cycle reaches 50%.

In this way, if the clock duty cycle inputted into the integrator is not 50% exactly, the duty cycle deviation will be accumulated in the output voltage of the integrator continuously. Therefore, the integrator can be used as a means for duty cycle detection. In addition, the detection accuracy can be very high, owing to the deviation accumulation effect. However, since the input is a differential input, the VDD and VSS of the input clock signals must be exactly equal to each other. The time constant determined by the resistors and capacitors has influence on the amplitude of ripples in the integration result, i.e., the higher the RC constant is, the lower the amplitude of ripples will be; in contrast, the lower the RC constant is, the higher the amplitude of ripples will be. That influence must be taken into consideration carefully in the design process.

Buffer Stages

Figure 5:
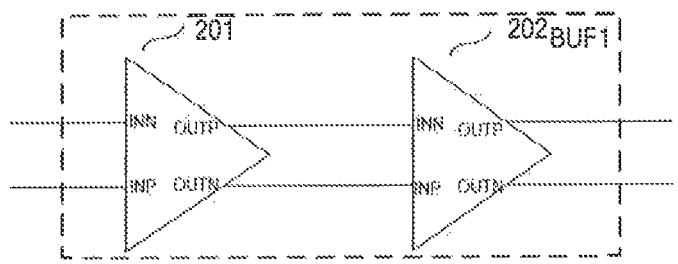
FIG. 5 is a structural block diagram of the first buffer stage.
Figure 6:
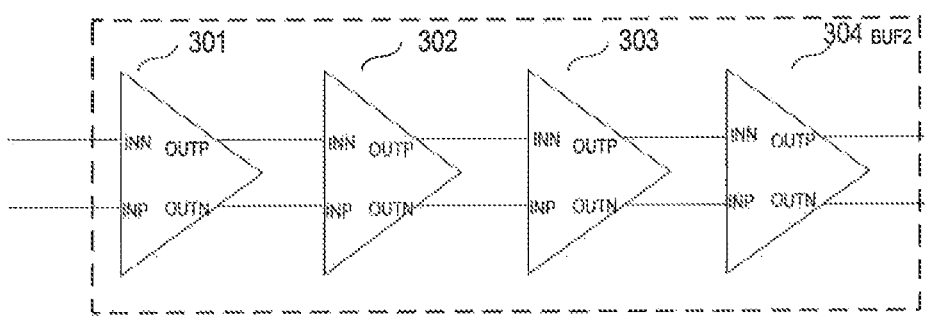
FIG. 6 is a structural block diagram of the second buffer stage.
Figure 7:
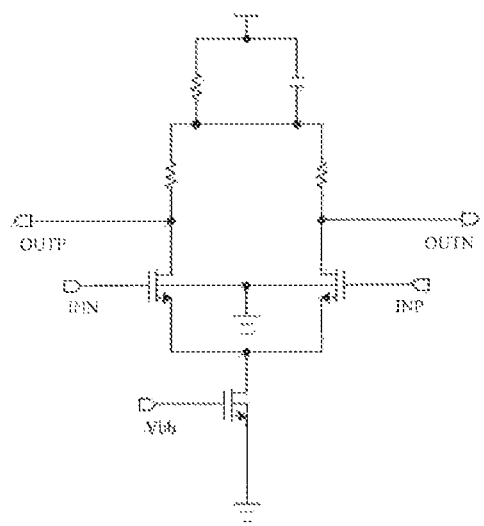
FIG. 7 is a schematic diagram of a basic buffer unit.

The first buffer stage and second buffer stage are shown in FIG. 5 and FIG. 6. The first buffer stage comprises two cascaded basic buffer units, and the second buffer stage comprises four cascaded basic buffer units, so as to reshape the output clock signals and improve driving power. The basic buffer unit is shown in FIG. 7. It employs a CML structure that is applicable to high-speed circuits, and mainly comprises two output resistors, input pair transistors, and a tail current source. Symmetric differential clock signals with low oscillation amplitude can be obtained by determining the sizes and parameters of the parts carefully.

While the present invention has been illustrated and described with reference to some preferred embodiments, the present invention is not limited to these. Those having ordinary skills in the art should recognize that various variations and modifications can be made without departing from the spirit and scope of the present invention as defined by the accompanying claims.

The invention claimed is:

1. A duty cycle calibration circuit for a high-speed full-differential clock, comprising: a first adjustment stage ADJ1, a first buffer stage BUF1, a second adjustment stage ADJ2, a second buffer stage BUF2, and a duty cycle detection stage DCD, wherein:

a first and a second signal input terminal at the left side of the first adjustment stage ADJ1 are connected to raw differential input signals (CLK+ and CLK−) to be calibrated;

output signals OUT1− and OUT1+ from a first and a second output terminal of the first adjustment stage ADJ1 are connected to a first and a second signal input terminal of the first buffer stage BUF1;

output signals OUTB1+ and OUTB1− from a first and second signal output terminal of the first buffer stage BUF1 are connected to a first and a second signal input terminal of the second adjustment stage ADJ2, to continue to calibrate the duty cycle further;

output signals OUT2− and OUT2+ from a first and a second signal output terminal of the second adjustment stage ADJ2 are connected to a first and a second signal input terminal of the second buffer stage BUF2;

output signals CKO+ and CKO− from a first and a second signal output terminal of the second buffer stage BUF2 are calibrated differential clock signals with a 50% duty cycle; clock signals CKO+ and CKO− from the first and second signal output terminals of the second buffer stage BUF2 are connected to a first and a second signal input terminal of the duty cycle detection stage DCD;

output signal CP from a first signal output terminal of the duty cycle detection stage DCD is fed back and connected to a third signal input terminal of the first adjustment stage ADJ1 and a third signal input terminal of the second adjustment stage ADJ2;

output signal CN from a second signal output terminal of the duty cycle detection stage DCD is connected to a fourth signal input terminal of the first adjustment stage ADJ1 and a fourth signal input terminal of the second adjustment stage ADJ2, so as to adjust the duty cycle; and CP and CN signals are positive control voltage and negative control voltages, respectively;

the first adjustment stage ADJ1 and second adjustment stage ADJ2 are identical to each other;

the first adjustment stage or the second adjustment stage comprises: a first transistor M1, a second transistor M2, a third transistor M3, and a fourth transistor M4, wherein, M1~M4 are PMOS transistors; and a fifth transistor M5, a sixth transistor M6, and a seventh transistor M7, wherein, M5~M7 are NMOS transistors;

source electrodes and substrates of M1, M2, M3, and M4 are connected to a power supply, respectively;

grid electrodes of M1 and M4 are connected to positive control voltage CP and negative control voltage CN, respectively;

drain electrode of M1, grid electrode and drain electrode of M2, and drain electrode of M5 are connected to each other, forming an output terminal for output signal OUT1−;

drain electrode of M4, grid electrode and drain electrode of M3, and drain electrode of M6 are connected to each other, forming an output terminal for output signal OUT1+; and substrates of M5 and M6 are grounded respectively; grid electrode of M5 is connected to the input signal CLK+, and grid electrode of M6 is connected to the input signal CLK−; source electrodes of M5 and M6 are connected, and then connected to drain electrode of M7; grid electrode of M7 is connected to bias voltage Vb, and source electrode and substrate of M7 are grounded respectively.

2. The duty cycle calibration circuit for a high-speed full-differential clock according to claim 1, wherein, the first buffer stage BUF1 comprises a first buffer and a second buffer that are cascaded serially;

the first and second signal input terminals of the first buffer are connected to the output signals OUT1+ and OUT1− from the first and second output terminals of the first adjustment stage ADJ1; the output signals from the first and second output terminals of the second buffer are differential clock signals OUTB1+ and OUTB1− after duty cycle calibration.

3. The duty cycle calibration circuit for a high-speed full-differential clock according to claim 2, wherein, the second buffer stage BUF2 comprises a first buffer, a second buffer, a third buffer, and a fourth buffer, which are cascaded serially;

the first and second signal input terminals of the first buffer are connected to the output signals OUT2+ and OUT2− from the first and second output terminals of the second adjustment stage, and the output signals from the first and second output terminals of the fourth buffer are differential clock signals CKO+ and CKO− with a 50% duty cycle, after two calibrations.

4. The duty cycle calibration circuit for a high-speed full-differential clock according to claim 3, wherein, the duty cycle detection stage DCD comprises a first resistor, a second resistor, a first capacitor, a second capacitor, and an amplifier;

one terminal of the first resistor and the second resistor are connected to the output signals CKO+ and CKO− from the first and second signal output terminals of the second buffer stage BUF2 respectively; the other terminal of the first resistor is connected to one terminal of the first capacitor and then connected to the negative input terminal of the amplifier; the other terminal of the second resistor is connected to one terminal of the second capacitor and then connected to the positive input terminal of the amplifier; the other terminal of the first capacitor is connected to the positive output terminal of the amplifier; the other terminal of the second capacitor is connected to the negative output terminal of the amplifier.

5. The duty cycle calibration circuit for a high-speed full-differential clock according to claim 4, wherein, the detection method employed by the duty cycle detection stage DCD comprises:

denoting the input signals as CKO+ and CKO− and the output signals as CP and CN, such that:

$$\frac{d}{dt}(CP) = \frac{d}{dt}\left\{\frac{1}{RC}\left[\int_0^{t_H}(VDD-VSS)dt + \int_{t_H}^{T}(VSS-VDD)dt\right]\right\}$$

$$\frac{d}{dt}(CN) = \frac{d}{dt}\left\{\frac{1}{RC}\left[\int_0^{t_H}(VSS-VDD)dt + \int_{t_H}^{T}(VDD-VSS)dt\right]\right\}$$

denoting the high-level duration of CKO+ as $t_H$ and the low-level duration as $t_L$, such that:

$$\frac{d}{dt}(CP) = \frac{d}{dt}\left\{\frac{1}{RC}[VDD(t_H-t_L)+VSS(t_L-t_H)]\right\}$$

$$\frac{d}{dt}(CN) = \frac{d}{dt}\left\{\frac{1}{RC}[VSS(t_H-t_L)+VDD(t_L-t_H)]\right\}$$

terminating the duty cycle adjustment when the duty cycle is 50% $t_H=t_L$, $$\frac{d}{dt}(CP) = 0, \frac{d}{dt}(CN) = 0;$$

decreasing CP further and increasing CN further, and continuing the duty cycle adjustment, till the duty cycle reaches to 50%, when the duty cycle is lower than 50% and $$\frac{d}{dt}(CP) < 0, \frac{d}{dt}(CN) > 0;$$

increasing CP further and decreasing CN further, and continuing the duty cycle adjustment, till the duty cycle reaches 50%, when the duty cycle is higher than 50% and $$\frac{d}{dt}(CP) > 0, \frac{d}{dt}(CN) < 0.$$

\* \* \* \* \*